US007533312B2

(12) United States Patent
Janes

(10) Patent No.: US 7,533,312 B2
(45) Date of Patent: May 12, 2009

(54) SYSTEM AND METHOD FOR TESTING OF ELECTRONIC CIRCUITS

(75) Inventor: Stephen D. Janes, Fort Collins, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 315 days.

(21) Appl. No.: 10/902,237

(22) Filed: Jul. 29, 2004

(65) Prior Publication Data
US 2006/0025953 A1 Feb. 2, 2006

(51) Int. Cl.
G01R 31/28 (2006.01)
G06F 11/00 (2006.01)

(52) U.S. Cl. .......................... 714/724; 714/33; 714/39; 714/30

(58) Field of Classification Search ................ 702/108; 714/101, 104, 739
See application file for complete search history.

(56) References Cited

U.S. PATENT DOCUMENTS

| 5,058,043 | A | * | 10/1991 | Skeirik | 700/167 |
| 5,854,889 | A | * | 12/1998 | Liese et al. | 714/43 |
| 6,754,850 | B2 | * | 6/2004 | Grey et al. | 714/33 |
| 6,971,084 | B2 | * | 11/2005 | Grey et al. | 717/106 |
| 7,058,469 | B2 | * | 6/2006 | Wang et al. | 700/121 |
| 7,093,249 | B2 | * | 8/2006 | Melamed et al. | 718/100 |
| 2002/0013519 | A1 | * | 1/2002 | Adams et al. | 600/300 |
| 2002/0124205 | A1 | * | 9/2002 | Grey et al. | 714/33 |
| 2002/0162059 | A1 | | 10/2002 | McNeely et al. | |
| 2003/0212938 | A1 | | 11/2003 | Sutton et al. | |
| 2004/0117792 | A1 | * | 6/2004 | Maly et al. | 718/100 |
| 2004/0147275 | A1 | * | 7/2004 | Dickson | 455/522 |
| 2004/0250031 | A1 | * | 12/2004 | Ji et al. | 711/162 |
| 2005/0176376 | A1 | * | 8/2005 | Liu | 455/67.16 |
| 2005/0283667 | A1 | * | 12/2005 | Batten et al. | 714/25 |

OTHER PUBLICATIONS

TDB-ACC-No. NN7806115 Tittle: Data Processor Diagnostic Test System. Jun. 1978 IBM.*

* cited by examiner

Primary Examiner—Cynthia Britt
Assistant Examiner—Guerrier Merant

(57) ABSTRACT

The system and method of the present invention combine multiple tests (15) into a batch and submit the batch for processing to exercise electronic circuits, for example, a managed network (25) such as a wireless network. The system and method insure that tests (15) are timely run by utilization of a batch submit trigger (42). When a test (15) has completed, the system and method return the results (11) of that particular test (15) to the user, regardless of whether or not the rest of the tests (15) in the batch have completed execution.

18 Claims, 4 Drawing Sheets

SYSTEM AND METHOD FOR TESTING OF ELECTRONIC CIRCUITS

BACKGROUND OF THE INVENTION

This invention relates generally to electronic testing, and more specifically to large scale integration of electronic testing over electronic networks.

To perform large-scale tests on network configurations requires a large number of individual tests to be run. Each test requires its share of resources when it is queued for execution. Most test execution platforms limit the size of the queue because of resource constraints. Thus, when the queue is full, the test execution platform must fall back into some kind of exception condition until an entry becomes available. This bottleneck can disrupt testing and limit the amount of effective testing that can be accomplished on the network.

In large-scale deployments, as many as 1,000 tests per hour are required to fully validate the system being tested. Conventional test configurations call for a platform that prepares and queues tests for execution and a platform that dequeues tests when there are resources available to execute the test. If the number of tests exceeds the size of the queue, and resource constraints dictate that the queue cannot be lengthened, queuing and execution of the tests could be delayed.

SUMMARY OF THE INVENTION

The problems set forth above as well as further and other problems are resolved by the present invention. The solutions and advantages of the present invention are achieved by the illustrative embodiments and methods described herein below.

The system and method of the present invention combine multiple test specifications and submit them for processing as a single test, thus providing expanded testing capability without equivalent increased resource usage. The system of the present invention includes a test preparer, a test queuer, and a test results manager. The test preparer receives a variety of tests, combines them into at least one batch, and maintains pointers to the individual tests in the batch. The test preparer might also create and append information to the batch that could be utilized to decode the batch's structure during further processing. The test preparer insures that tests are timely run by concluding construction of the batch within a pre-determined amount of time. The test queuer prepares the batch for submission to a conventional test execution environment's test queue. In particular, the test queuer formats the batch of tests so that the test execution environment views the batch as a single test with multiple test cases. The test queuer submits the batch to a test queue maintained by the test execution environment, which dequeues the batch and executes the tests within the batch. The test execution environment receives results from the tests as they are executed and provides the results to, for example, a data sink such as, for example, a results database. A test results manager of the present invention monitors the results database for the completion of any tests within the batch. When a test has completed, the test results manager returns the results of that particular test to the user, regardless of whether or not the rest of the tests in the batch have completed execution.

The method of the present invention includes the steps of combining a variety of tests into a batch substantially within the time constraints of the tests utilized, submitting the batch to a test execution environment test queue, executing the tests in the batch, and providing the results of executing the tests substantially as each tests completes execution.

For a better understanding of the present invention, reference is made to the accompanying drawings and detailed description. The scope of the present invention is pointed out in the appended claims.

DETAILED DESCRIPTION OF THE INVENTION

Figure 1:
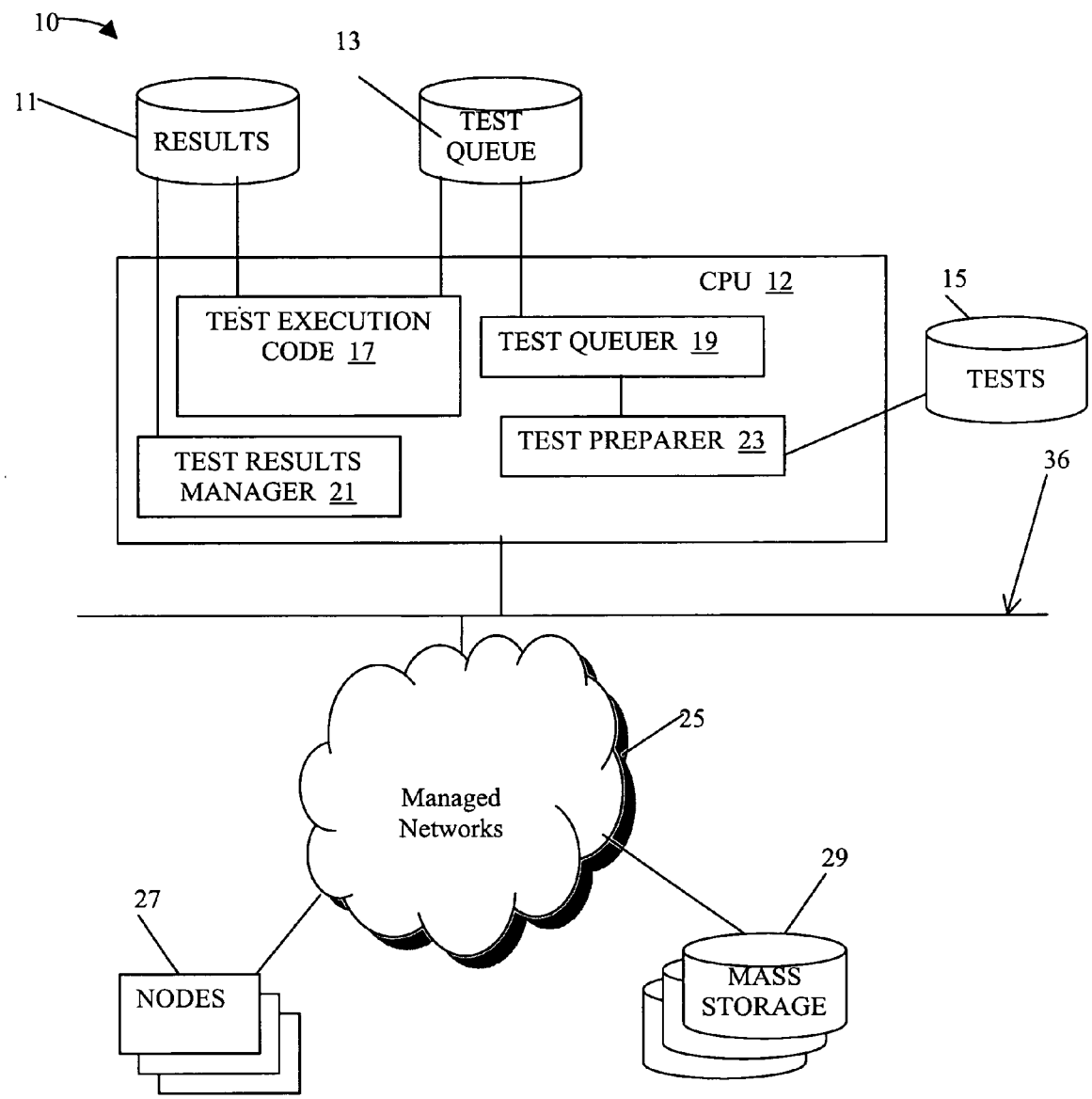
FIG. 1 is a schematic block diagram of the environment in which the system and method of the present invention can execute.

The present invention is now described more fully hereinafter with reference to the accompanying views of the drawing, in which the illustrative embodiments of the present invention are shown.

Referring now to FIG. 1, test environment 10 of an illustrative embodiment of the present invention includes test preparer 23 which accesses pre-selected tests 15, such as, for example, conventional tests, and readies them for queuing by test queuer 19 by combining tests 15 into a batch. Test queuer 19 communicates with test execution code 17 by filling test queue 13 with the batch. Test execution code 17, executing on CPU 12, dequeues the batch from test queue 13, and executes tests 15 for the purpose of exercising electronic circuits such as managed networks 25, for example a communications network. Managed networks 25 may include, for example, computer nodes 27, computer readable media such as mass storage 29, and any other type of electronic device, connected by electronic interface 36, which may encompass such technology as wireless, internet, local area network, etc. Test execution code 17 communicates with test results manager 21 by updating a data sink, such as, for example, results 11 for each completed test 15.

Figure 2A:
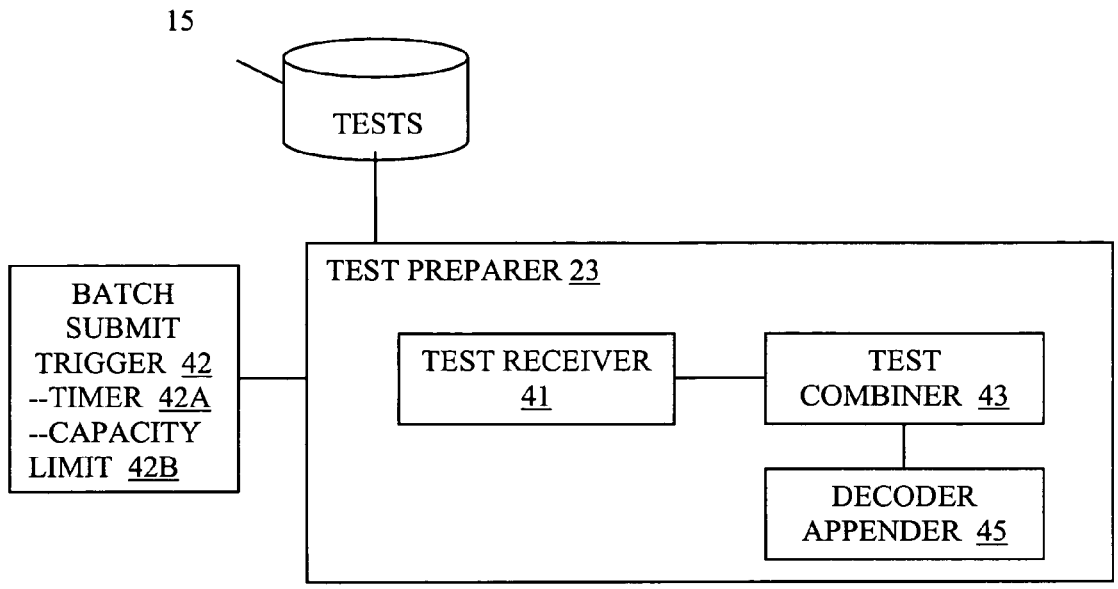
FIG. 2A is a schematic block diagram of the components of the test preparer component of the present invention.
Figure 3:
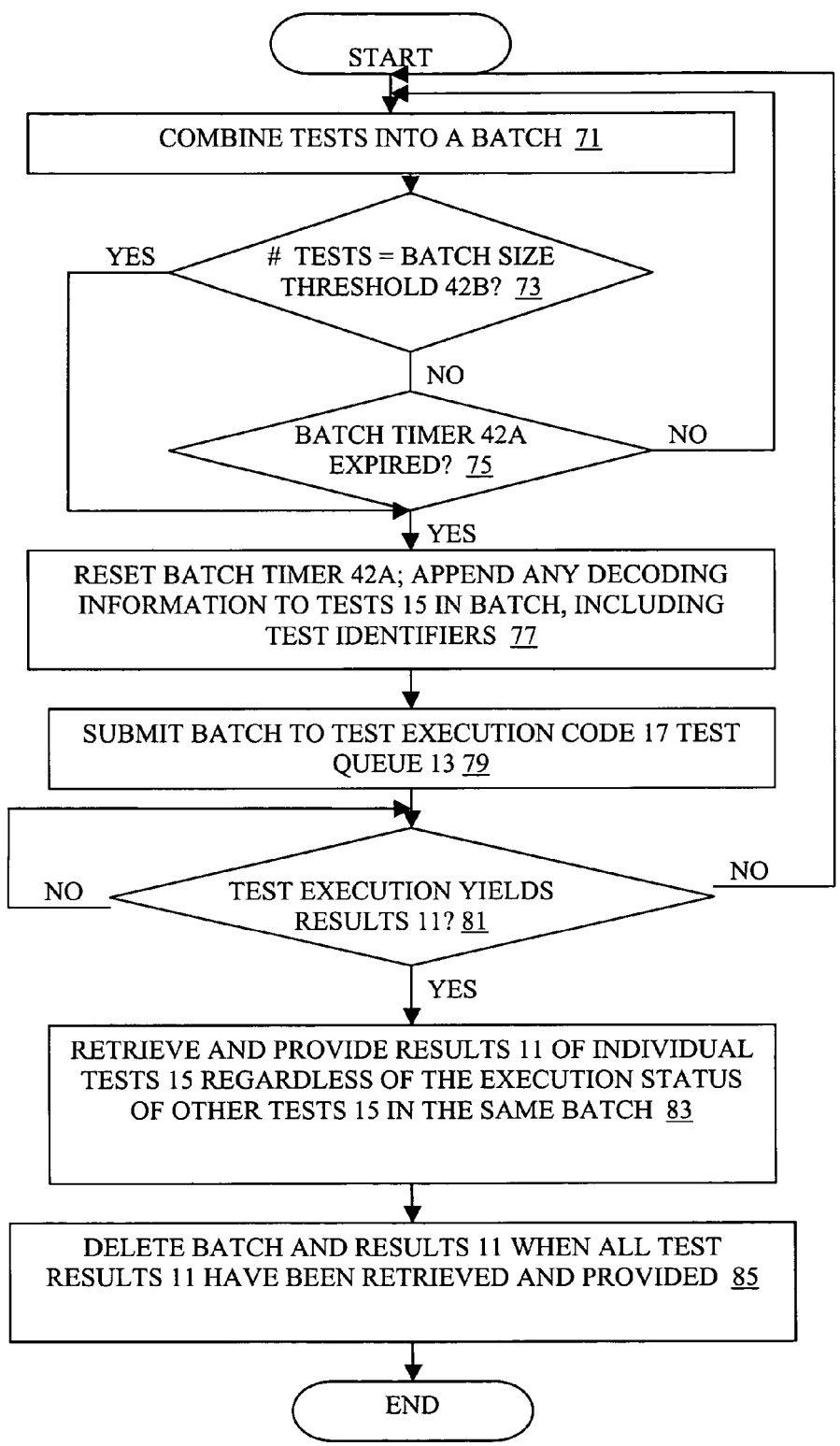
FIG. 3 is a flowchart of the method of the illustrative embodiment of the present invention.

Referring now to FIG. 2A, test preparer 23 prepares one or more test(s) 15 for execution over time based upon test frequencies such as one minute, five minutes, fifteen minutes, etc. Test preparer 23 can include test receiver 41, test combiner 43, and decoder appender 45. In the illustrative embodiment, tests 15 are polymorphic in nature, that is, test receiver 41 can accept any test 15 regardless of type (e.g. MMS, SMS, GPRS WAP, etc.). As test receiver 41 receives each test 15, test 15 is added to a "batch" which collects tests 15 and prepares them to be combined for submittal to test queuer 19 (FIG. 1). In order to execute the tests in a timely manner, test combiner 43 recognizes certain batch submit triggers 42, such as, for example, the expiration of a timer 42A or the filling of a pre-determined batch size threshold 42B. These triggers could be user-configurable. In the case of timer 42A, test combiner 43 discontinues filling a batch with tests at the expiration of timer 42A, whether the batch is filled or not. In the case of batch size threshold 42B, a batch size is pre-determined, based on the needs and resources of the test execution environment. When the batch size threshold 42B is reached, test combiner 43 discontinues filling the batch. In both cases, the timer 42A is reset when test combiner 43 discontinues filling the batch. There can be other types of triggers, depending on the needs and resources of the test execution environment. Test combiner 43 determines the beginning and ending of each test within the batch, for example by maintaining index values, and provides this information along with the batch to decoder appender 45. Decoder appender 45 determines what, if any, information must accompany the batch and creates and appends and/or prepends that information to the batch. For example, an executable image could accompany the batch to automatically prepare the batch for interpretation by test execution code 17 (FIGS. 1 and 3). Decoder appender 45 invokes test queuer 19 (FIGS. 1 and 3) with the completed batch.

Figure 2B:
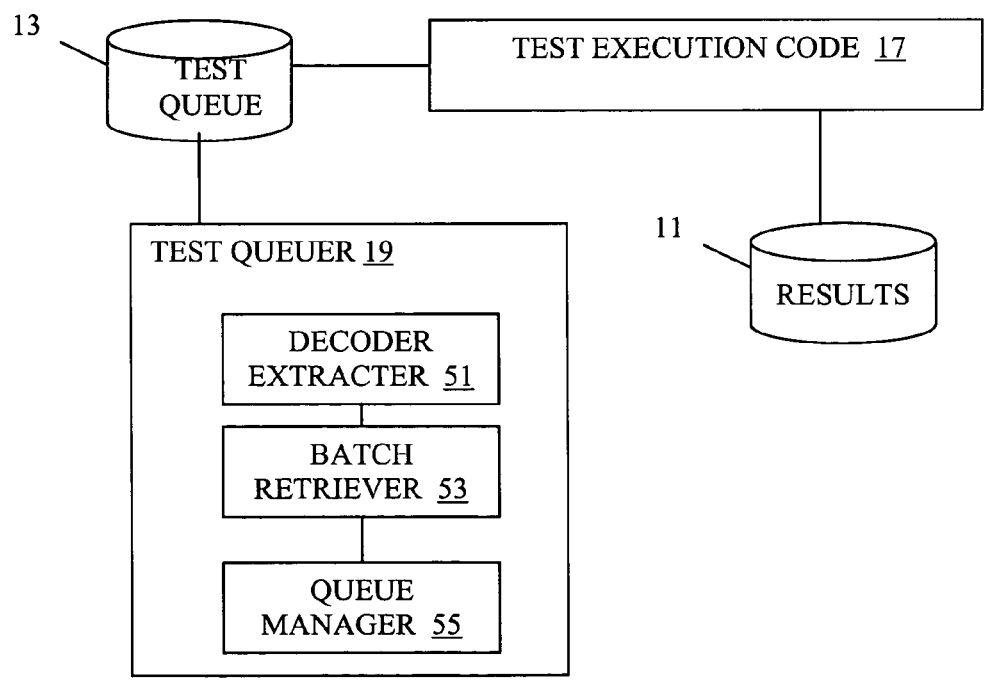
FIG. 2B is a schematic block diagram of the components of the test queuer component of the present invention.

Referring now to FIG. 2B, test queuer 19 can include decoder extracter 51, batch retriever 53, and queue manager 55. Decoder extracter 51 determines if there is appended and/or prepended decoding information that could be necessary to determine the layout of the batch, and batch retriever 53 decodes the batch according to the decoding information. Queue manager 55 provides mappings between the tests 15 in the batch and the requirements of test execution code 17 for both tests 15 and results 11, regardless of the test. Queue manager 55 can map all of the test definitions into a single test definition consistent with test execution code 17. Test execution code 17 executes the batch as a single test run having many test cases, which are the individual tests that originally formed the batch, within it.

Figure 2C:
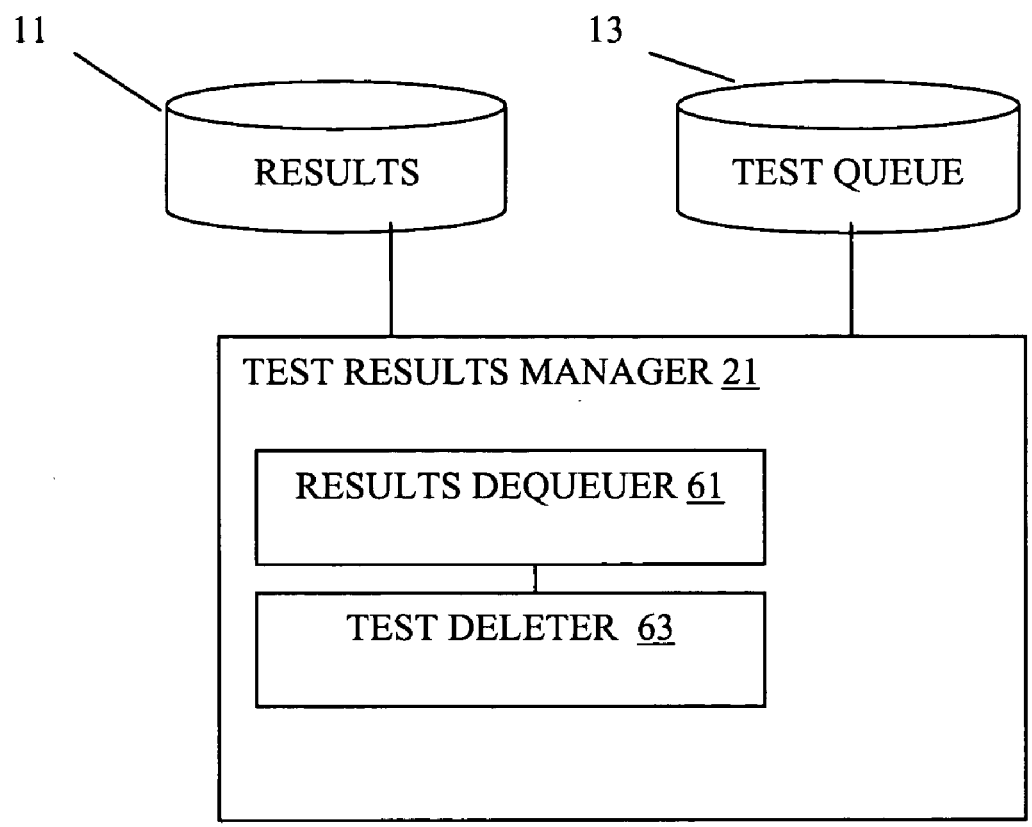
FIG. 2C is a schematic block diagram of the components of the test results manager component of the present invention.

Referring now to FIG. 2C, test results manager 21 can include results dequeuer 61 and test deleter 63. Results dequeuer 61 monitors results 11 (see also FIG. 1) (for example, a test execution code database) for an indication that any of the tests from the batch have completed execution. Each test can return results 11 separately from other tests 15 in the same batch, and results dequeuer 61 can access results 11 of each test 15 without awaiting the completion of other tests 15 in the batch. In this fashion, errors or problems may be detected and resolved quicker. To detect test 15 completion, results dequeuer 61 can retrieve an indication that a test case within a batch identified, for example, by primary keys such as 'TestRunID' and 'TcID' (test case ID), has completed execution. Results dequeuer 61 can provide results 11 to the user as soon as test 15 completes, without waiting for the entire batch to complete. Results 11 could be formatted, for example, in a table such as the following.

| testrunId | tcId | tcStatus | A_value | b_value | ... | f_value |
|---|---|---|---|---|---|---|
| 10354 | 1 | Pass | 102.3 | 95.3 | | 4.5 |
| 10354 | 2 | Pass | 89.3 | 99.3 | | 5.3 |
| 10354 | 3 | Pass | 94.1 | 89.7 | | 6.8 |
| 10354 | 4 | Fail | 83.2 | | | |
| 10354 | 5 | Pass | 95.5 | 78.2 | | 7.2 |
| 10354 | 6 | Running | | | | |

Test deleter 63 can track the progress of tests 15 (FIG. 1) in the batch and, after the last test 15 in the batch has completed execution, test deleter 63 can delete test definitions in test queue 13 and results 11 associated with the batch. If the batch is associated with a thread, test deleter 63 can also delete the thread. A thread is a stream of executable code that has the ability to be scheduled. A computer program can have multiple threads and therefore can have as many flows of control as there are threads. Each thread can execute independently, having its own sequence of instructions, and concurrently with other computer programs on separate threads.

Referring now primarily to FIG. 3, the method of the illustrative embodiment of the present invention includes the step of combining tests 15 (FIG. 1) into a batch (method step 71). If the number of tests 15 meets a batch size threshold (decision step 73), the method then includes the steps of resetting a batch timer, and appending any decoding information to tests 15 in the batch (method step 77). If the number of tests 15 does not meet batch size threshold 42B (FIG. 2A) (decision step 73) and batch timer 42A (FIG. 2A) has not expired (decision step 75), the method then returns to combine tests 15 into a batch. If batch timer 42A has expired (decision step 75), the method then continues execution at method step 77. The method can further include the step of submitting the batch to test execution code 17 (FIG. 1) test queue 13 (FIG. 1) (method step 79). If test execution yields results 11 (FIG. 1) (decision step 81), the method then includes the steps of retrieving and returning results 11 of individual tests 15 regardless of the status of other tests 15 in the same batch (method step 83), and deleting the batch and results 11 when all test results 11 have been retrieved and returned (method step 85). If test execution does not yield results 11 (decision step 81), the method then includes the substantially simultaneous steps of continuing to monitor results 11 and also proceeding to combine further tests in another batch (method step 71).

Although the invention has been described with respect to various embodiments and methods, it should be realized that this invention is also capable of a wide variety of further and other embodiments and methods within the spirit and scope of the appended claims.

What is claimed is:

1. A system for testing at least one electronic circuit comprising:
   a test preparer capable of combining a plurality of pre-selected tests into a batch;
   a test queue capable of i) formatting the batch to cause test execution code to view the ore-selected tests of the batch as a single test with multiple test cases, and ii) submitting said batch to a test queue maintained by the test execution code, the test execution code executing said plurality of pre-selected tests in said batch, the test execution code providing results from executing said plurality of pre-selected tests; and
   a test results manager capable of monitoring said results, said test results manager capable of retrieving said results for each of said plurality of pre-selected tests regardless if all of said plurality of pre-selected tests have completed execution,
   wherein said plurality of pre-selected tests is capable of testing the at least one electronic circuit.

2. The system as defined in claim 1 wherein said plurality of pre-selected tests comprises:
   a wireless test.

3. The system as defined in claim 1 wherein said test preparer comprises:
   a batch submit trigger capable of determining when said batch is complete.

4. The system as defined in claim 3 wherein said batch submit trigger comprises a timer and a capacity limit.

5. The system as defined in claim 3 wherein said batch submit trigger is user-selectable.

6. The system as defined in claim 1 wherein said test results manager comprises:
   a test deleter capable of deleting said batch and said results after said results have been retrieved for all of said plurality of pre-selected tests.

7. The system as defined in claim 1 wherein said test preparer is capable of combining a polymorphic set of tests in said batch.

8. A method for testing of at least one electronic circuit comprising the steps of:
   (a) combining a plurality of tests into a batch, said plurality of tests capable of testing the at least one electronic circuit;
   (b) formatting the batch to cause a test execution environment to view the tests of the batch as a single test with multiple test cases;
   (c) submitting the batch to a test execution environment test queue;
   (d) executing the plurality of tests in the batch; and
   (e) providing the results of the executed plurality of tests to a data sink, said step of providing the results happening substantially synchronously with the completion of each of said plurality of tests,
   wherein said step of combining takes place substantially within pre-defined time constraints of the plurality of tests.

9. The method as defined in claim 8 further comprising the step of:
   deleting the batch and the results after the results are returned from all of the plurality of tests.

10. The method as defined as in claim 8 further comprising the step of:
    substantially adhering to the pre-defined time constraints by conforming to a batch submit trigger.

11. The method as defined in claim 10 wherein the batch submit trigger comprises a batch timer and a batch size threshold.

12. The method as defined in claim 8 further comprising the step of executing steps (a)-(e) within a computer node.

13. The method as defined in claim 8 further comprising the step of executing steps (a)-(e) within a communications network including at least one computer node.

14. The method as defined in claim 8 further comprising the step of enabling a computer data signal embodied in electromagnetic signals traveling over a communications network to carry information capable of causing a computer node in the communications network to execute steps (a)-(e).

15. The method as defined in claim 8 further comprising the step of providing a computer readable medium having instructions embodied therein for executing steps (a)-(e).

16. A system for testing at least one electronic circuit:
    means for combining a plurality of tests into a batch;
    means for formatting the batch to cause a test execution environment to view the tests of the batch as a single test with multiple test cases;
    means for submitting said batch to a test execution environment test queue;
    means for executing the plurality of tests in said batch; and
    means for providing the results of the executed plurality of tests to at least one data sink, said means for providing said results happening substantially synchronously with completing each of said plurality of tests,
    wherein said means for combining takes place substantially within pre-defined time constraints of the plurality of tests, and wherein the plurality of tests is capable of testing the at least one electronic circuit.

17. The system as defined in claim 16 further comprising:
    means for deleting the batch and the results after the results are provided from all of said plurality of tests.

18. The system as defined as in claim 16 further comprising:
    means for substantially adhering to said pre-defined time constraints by conforming to a batch submit trigger.

* * * * *

UNITED STATES PATENT AND TRADEMARK OFFICE
CERTIFICATE OF CORRECTION

| | |
|---|---|
| PATENT NO. | : 7,533,312 B2 |
| APPLICATION NO. | : 10/902237 |
| DATED | : May 12, 2009 |
| INVENTOR(S) | : Stephen D. Janes |

It is certified that error appears in the above-identified patent and that said Letters Patent is hereby corrected as shown below:

On the Title page, in field (56), under "Other Publications", in column 2, line 1, delete "Tittle:" and insert -- Title: --, therefor.

In column 4, line 37, in Claim 1, delete "queue" and insert -- queuer --, therefor.

In column 4, line 38, in Claim 1, delete "ore-selected" and insert -- pre-selected --, therefor.

Signed and Sealed this

Fourteenth Day of July, 2009

JOHN DOLL
*Acting Director of the United States Patent and Trademark Office*